United States Patent [19]
Keller

[11] Patent Number: 5,644,153
[45] Date of Patent: Jul. 1, 1997

[54] METHOD FOR ETCHING NITRIDE FEATURES IN INTEGRATED CIRCUIT CONSTRUCTION

[75] Inventor: David J. Keller, Boise, Id.

[73] Assignee: Micron Technology, Inc., Boise, Id.

[21] Appl. No.: 551,169

[22] Filed: Oct. 31, 1995

[51] Int. Cl.[6] .......................... B44C 1/22; H01L 29/792; H01L 21/302
[52] U.S. Cl. .................. 257/324; 257/374; 257/317; 257/410; 257/411; 257/640; 257/647; 257/649; 156/643; 156/646; 156/662; 156/665; 156/659.1; 437/225; 437/235; 437/241; 437/244
[58] Field of Search ..................... 257/324, 374, 257/397, 410, 411, 640, 647, 649; 156/643, 646, 659.1, 662, 665; 437/225, 235, 241, 244

[56] References Cited

U.S. PATENT DOCUMENTS

5,326,431  7/1994  Kadomura ..................... 257/640

Primary Examiner—Edward Wojciechowicz
Attorney, Agent, or Firm—Workman, Nydegger and Seeley

[57] ABSTRACT

A process for etching nitride layers in three steps is disclosed. The process comprises selecting a process chemistry of $CF_4$ to $CHF_3$ to set a predetermined critical dimension bias; conducting a primary etch of the process chemistry which will have a high etch rate; and conducting a secondary etch of ion bombardment having a lower etch rate and high selectivity to pad oxide. In selecting the process chemistry, selecting greater amounts of $CHF_3$ will result in higher polymer concentration on the etched sidewall. Varying the pressure and power can also be used to vary the polymer concentration. This in turn is used to select the desired critical dimension bias. The secondary etch uses a mixture of $NF_3$ and HBr and is performed at a high pressure and a low power to promote high nitride to oxide selectivity. The secondary etch removes the majority of polymer from the nitride sidewalls and cleans the polymer from the chamber walls, resulting in an anisotropic etch and a high number of wafers produced before cleaning is necessary.

29 Claims, 3 Drawing Sheets

METHOD FOR ETCHING NITRIDE FEATURES IN INTEGRATED CIRCUIT CONSTRUCTION

BACKGROUND OF THE INVENTION

1. The Field of the Invention

The present invention relates to the formation on of nitride features in the process of producing integrated circuits. More particularly, the present invention is directed to a method for etching a nitride layer on a semiconductor wafer that is highly selective to oxide and that has a predeterminable and adjustable critical dimension bias, especially when etching a layer of nitride over oxide.

2. The Relevant Technology

In the current rapid evolution of integrated circuits, semiconductor devices are being formed on the silicone substrates of integrated circuits at increasingly higher device densities and smaller feature sizes. New problems are being presented by the device shrinkage and increased density of semiconductor devices. One such problem is the necessity of building an efficient and reliable process to separate active devices that function on the current miniaturized scale. One method previously used is termed "local oxidation of silicon" (LOCOS) process. The LOCOS process involves the use of a temporary patterned nitride layer which is used as a protection or resistant area to cover the future active areas during the subsequent field oxidation process in forming CMOS gate structures. One example of a process for etching nitride that is being employed in a LOCOS process is taught in U.S. Pat. No. 5,336,395 to David J. Keller et al.

Figure 1:
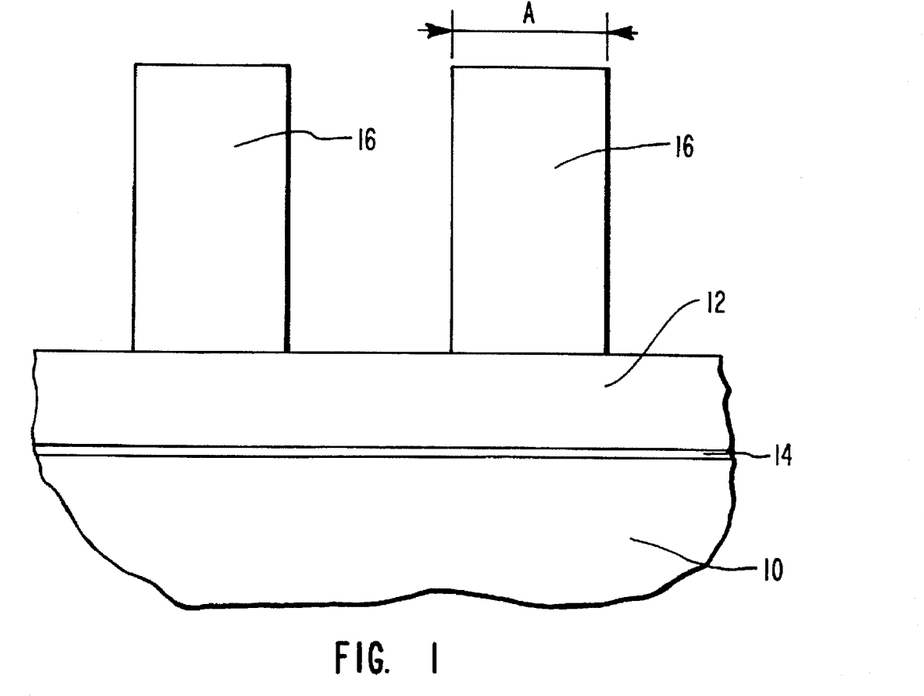
FIG. 1 is a schematic cross-section of a semiconductor substrate having thereon a pad oxide over which is deposited a nitride layer with a patterned photoresist layer over the nitride layer.
Figure 2:
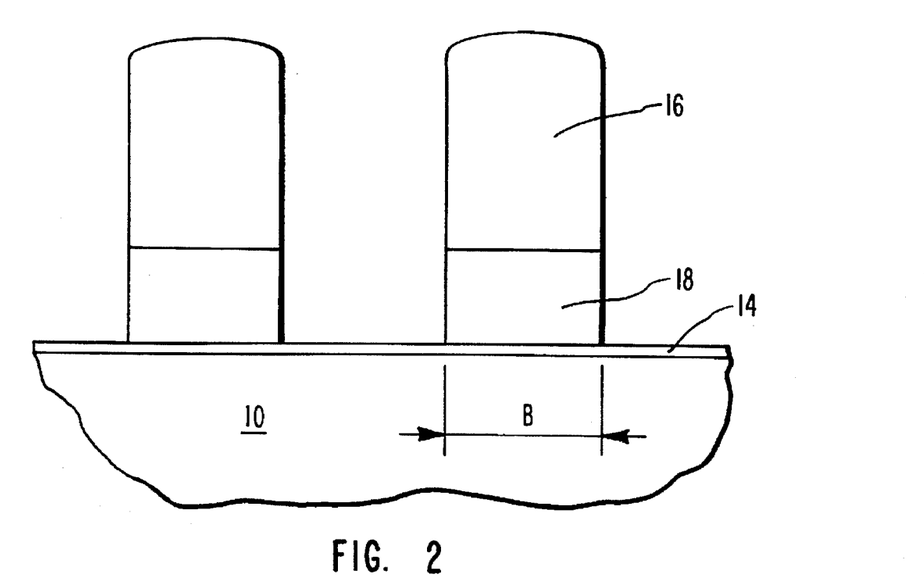
FIG. 2 is a schematic cross-section of the semiconductor substrate of FIG. 1 subsequent to etching as an example of the result ultimately desired by the novel etching process.

One requirement of using nitride layers with CMOS processes, such as the LOCOS process, is that the nitride layers must be patterned early in the process in preparation for field oxidation with little or no critical dimension bias. Critical dimension bias is defined as the difference in a feature measurement before and after a process flow step, such as comparing the dimension of a feature before being etched and after the etch is completed. FIG. 1 shows a critical dimension A of a layer of patterned photoresist 16 before etching a nitride layer 12. FIG. 2 shows an idealized critical dimension B of pattern photoresist layer 16 and a nitride feature 18 after etching nitride layer 12. A critical dimension bias between A and B, respectively, of FIGS. 1 and 2 will preferably be zero. Although at times a positive or negative critical dimension bias is desired, for the most part a critical dimension bias of zero is more desirable. That is, it is preferred that the critical dimension does not grow or shrink during the etch step.

Figure 3:
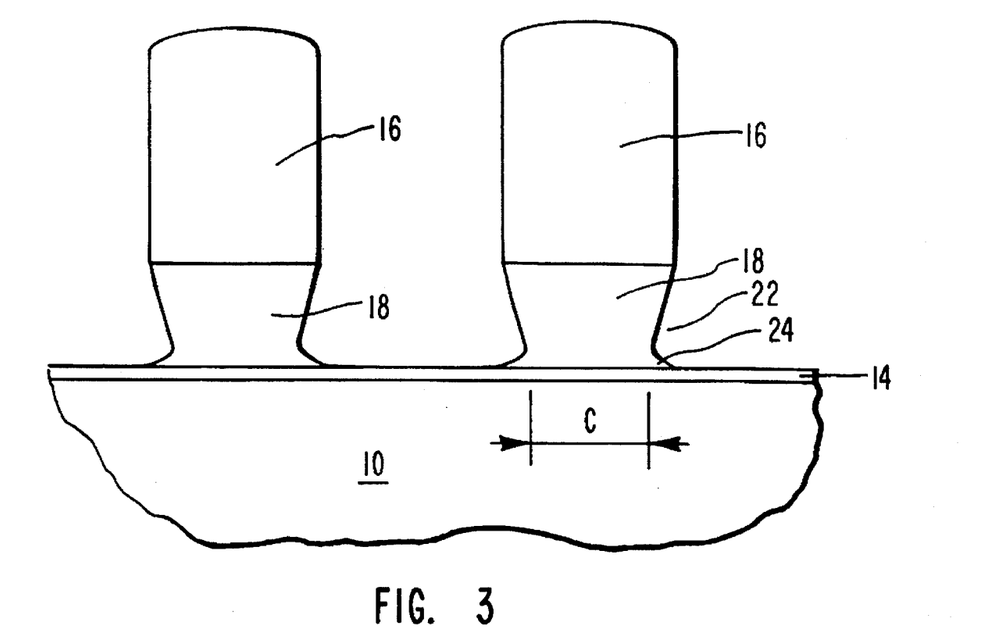
FIG. 3 is a schematic cross-section of the semiconductor substrate of FIG. 1 showing an undesirable undercut of a nitride feature.

FIG. 3 shows an example of a negative critical dimension bias. Nitride feature 18 is shown as having an undercut resulting in a substantially negative critical dimension bias. Also shown are feet 24 at a base 22 of nitride feature 18, which feet 24 are undesirable.

In the LOCOS process, and other processes using patterned nitride features, the nitride feature must be etched in such a manner as to be selective to an underlining layer of oxide, such as a pad oxide. Selectivity to the pad oxide results in an etch which stops on the pad oxide without "punching through" to damage the underlining silicon substrate. With the shrinkage of device dimensions, however, pad oxides are necessarily being reduced in thickness. The benefit of a thinner pad oxide is that a smaller isolation of LOCOS can be achieved without damage of the underlying silicon substrate. It is beneficial to prevent silicon substrate damage to prevent current leakage.

A thinner pad oxide requires etch processes with greater selectivity to oxide in order to etch superadjacent nitride layers, while still stopping on the pad oxide. Prior art etch processes have had difficulty in maintaining this pad oxide selectively without undesired side i effects such as undercutting and formation of feet described above.

Furthermore, the increasing shrinking and more structurally diverse integrated circuits require smaller line widths. This in turn necessitates a broader depth of focus of photolithography stepper machines. In order to attain a broader depth of focus, thinner photoresist layers must be used when masking and patterning the layer of nitride. Thinner photoresist requires better photoresist selectivity of the etch process. A benefit of a thinner photoresist layer is that smaller sizes can be achieved, such as smaller line sizes or smaller feature sizes.

An emphasis on process chemistry has been used in the past to make thinner photoresist layers. Process chemistry methods can result in nitride etches that are highly selective to oxide, but also result in large formation of polymers, both on the wafer itself as well as on the etcher chamber walls. A buildup of the polymer on the etcher chamber wall lowers the number of wafers that can be etched by the reaction chamber between cleaning cycles of the reaction chamber. A high polymer formation also leads to high fluctuations in etch rate. Additionally, processes that result in high polymer formation are very sensitive to pattern density and therefore to loading effects. Loading effects refer to uneven etching of the wafer between areas with more densely congregated features and more open areas due to varied etch rates. Furthermore, when a pattern to be etched is changed even slightly in a processing step, as normally occurs where processed lines are used to fabricate more than one semiconductor product, such process lines must then be reoptimized with the change of product type. Reoptimization is both costly and time consuming when running process lines with multiple product.

Other nitride etch processes that are highly selective to oxides tend to have large negative critical dimension bias, due mainly to large isotropic etching of the nitride side wall of nitride features. These processes typically use $SF_6$ to coat the nitride side walls. $SF_6$ also causes etch non-uniformity problems due to loading.

As a further example of the prior art, U.S. Pat. No. 5,336,395 mentioned above, teaches the use of $Cl_2$ to coat the sidewall of the nitride feature to prevent undercut. The use of $Cl_2$, however, slows the etch rate of nitride dramatically and increases the etch rate of photoresist, leading to an undesirable low photoresist selectivity. Low photoresist selectivity leads to large critical dimension bias variation and critical dimension repeatability problems, wafer to wafer, and lot to lot.

Many of the highly selective nitride etch processes use gases such as $CH_2F_2$, and $CH_3F_3$. These processes can achieve high selectivities of up to 15:1 nitride to oxide etching, but also cause high polymer formation on the etcher reaction chamber walls, leading to an undesirably low number of wafers that can be etched in the reaction chamber between cleaning cycles of the reaction chamber, Thus, these processes also have undesirable aspects.

In an example of the prior art difficulties, and referring to FIG. 3, the results of a prior art process for etching nitride can be seen. FIG. 3 shows a typical result of a thin photoresist layer 16 and a thin pad oxide 14, as is increasingly required by more highly miniaturized devices. A critical dimension C is seen in FIG. 3 as having a highly negative critical dimension bias as compared to dimension A of FIG. 1. This has resulted in an undercut 22 and the formation of feet 24.

Prior art processes suffer from loading effects, poor uniformity, poor nitride to oxide selectivity, or poor or inconsistent critical dimension bias, which make such prior art processes inadequate for etching submicron nitride features where thin photoresist layers and thin pad oxides are used.

A need exists in the art for a process which overcomes the foregoing prior art problems. Specifically, a need exists for a process which can etch nitride spacers and other patterned nitride layers with a high selectivity to both thin pad oxides and thin photoresist layers, and which will maintain a desirable critical dimension bias. Additionally, it would be beneficial if such a process were capable in resulting in a selectable critical dimension bias.

SUMMARY AND OBJECTS OF THE INVENTION

The present invention seeks to resolve the above and other problems which have been experienced in the art. More particularly, the present invention constitutes an advancement in the art by providing an improved method for etching nitride on a silicon substrate.

The primary object of the present invention is to overcome the problems of the prior art processes.

It is an object of the present invention to provide a method for etching nitride on a silicon substrate with a high selectivity to oxide in order that the goal of semiconductor device miniaturization can be furthered.

It is also an object of the present invention to provide a nitride etching method that can be used with thin photoresist layers.

It is likewise an object of the present invention to provide a nitride etching method that can be used with thin pad oxides.

It is a further object of the present invention to provide a nitride etching method that has a critical dimension bias that is selectable in a predictable manner by varying specific etching process parameters.

It is yet another object of the present invention to provide an nitride etching method that is performed in a reaction chamber, such as an REI or MREI chamber, and that sustains very low levels of polymer coating on the reaction chamber walls, thereby maintaining a high number of wafers that can be etched between cleaning cycles of the reaction chamber.

It is an even further object of the present invention to provide an etching method that results in a high uniformity in feature size, which uniformity is achievable in a variety of device densities and device size variations.

It is still further an object of the present invention to provide a nitride etching method for etching nitride on a silicon substrate, which method is not pattern dependent, such that different patterns producing different device structures can be used in the same process line without the need to re-optimize the process line in between production runs.

To achieve the foregoing objects, and in accordance with the invention as embodied and broadly described herein, a two-step process is provided for etching a patterned nitride layer on a silicon substrate. In the first step, a process chemistry is selected for performing an etch in a reaction chamber containing a wafer having nitride features with side walls and a superadjacent layer of photoresist thereon. The process chemistry is selected in order to deposit a desired amount of polymer on the side walls of the nitride feature to be etched. The process chemistry comprises a carbon containing fluorine compound. Such a compound has a good selectivity to photoresist, which enables the photoresist layer to be relatively thin. Preferably, the carbon containing fluorine compound will be a ratio of two compounds. The first compound contains both carbon and fluorine, an example of which is $CF_4$. The second compound contains carbon, hydrogen, and fluorine, an example of which is $CHF_3$. Selecting greater amounts of the second compound will result in higher polymer depositions on the sidewalls of the nitride features to be etched. Selecting lower amounts of the second compound will result in lower polymer deposition upon the sidewalls of the nitride features to be etched.

By selecting a higher or lower amount of polymer to be deposited, the critical dimension bias of the nitride features can be selected. Greater amounts of polymer deposition will result in a higher critical dimension bias, and lower amounts of polymer deposition will result in a higher critical dimension bias.

Once the process chemistry is selected for the first step, a primary or initial etch is performed in the first step. The primary etch utilizes the process chemistry in concentrations selected for the first step. During the primary etch, the nitride layer and overlying patterned photoresist are exposed to the process chemistry. This is done in a reaction chamber under controlled conditions, and preferably in a RIE or MRIE chamber. During the primary etch, nitride is etched at a high rate, with a substantial portion of the nitride being etched away. Polymer will be deposited on the sidewalls of the nitride features.

Preferably, the period of time for the primary etch will be sufficient to etch through most of the nitride layer, but will be short enough so that the higher etch rate of the nitride will not etch through the nitride layer to the pad oxide. The primary etch may utilize known end point detection techniques, and a percentage over etch may also be used to determine the proper period of time for the primary etch. The critical dimension bias can also be adjusted by varying the pressure and power of the primary etch. Following the first etch, some non-uniformity across the wafer will remain.

In the second step of the novel nitride etching method, a final etch is performed. The final etch functions to remove non-uniformities that remain after the primary etch performed in the first step. The final etch comprises ion bombardment of $NF_3$ and HBr under the conditions of high pressure and low power, resulting in a bombardment with a low energy. The low energy of the ion bombardment promotes nitride etching with high selectivity to oxide. Preferably, the nitride etch rate of the final etch is less than the nitride etch rate of the primary etch. The polymer deposited on the sidewall of nitride features in the primary etch of the first step will protect the nitride structures from being etched beyond the desired critical dimension. The final etch will not etch through the pad oxide. The final etch has a greater selectivity to oxide than does the primary etch, yet will still maintain the proper critical dimension bias.

During the final etch, most of the polymer deposited during the primary etch of the first step is removed from the nitride features. A proper selection during the first step of the polymer deposition will prevent the final etch from etching through the polymer to over etch the nitride features. Furthermore, the final etch will cause the reaction chamber wall, as a result of the ion bombardment in the final etch, to be cleaned substantially of all polymer deposits. The "self-cleaning" of the reaction chamber walls during the final etch will result in a relatively clean reaction chamber capable of processing the high number of wafers therethrough before the reaction chamber must be cleaned. As a result, a high number of wafers between cleans is achieved, which is a beneficial aspect of the present inventive nitride etching method.

As a result of the present inventive method, nitride structures used in CMOS LOCOS processes can be formed and will have a desirable critical dimension bias and proper selectivity to both underlying pad oxide and overlying photoresist layers. The critical dimension bias can be selected to be positive, negative, or zero. Furthermore, the inventive process can be performed with both thinner photoresist layers and thinner pad oxides than heretofore known while maintaining a desired critical dimension bias. Thus, the process of the present invention promotes even greater miniaturization of semiconductor devices. Furthermore, the process of the present invention results in greater uniformity of feature sizes, higher wafers between cleans in reaction chambers used for etching, and a lower defect rate at higher miniaturization levels.

These and other objects and features of the present invention will become more fully apparent from the following description and appended claims, or may be learned by the practice of the invention as set forth hereinafter.

BRIEF DESCRIPTION OF THE DRAWINGS

In order to understand the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings listed herein after.

DETAILED DESCRIPTION OF THE PREFERRED EMBODIMENTS

The present invention comprises a method for etching a nitride layer on a silicon substrate. The figures discussed below illustrate the present invention as applied to a typical LOCOS system and are representative of applications of methods of the present invention in which a nitride layer must be etched. The method of the present invention, however, is not restricted to the examples given. Further, the inventive method is useful for etching nitride in any application which nitride structures are etched and require high selectivity, uniformity, and a controllable critical dimension bias.

In FIG. 1, a silicon substrate 10 has superadjacent thereto a pad oxide 14 over which is deposited a nitride layer 12. A layer of photoresist 16 has been patterned over nitride layer 12.

The first step of the inventive nitride etching process begins with selecting a carbon containing fluorine compound. Preferably, the selected process chemistry has a ratio of a first compound which contains carbon and fluorine and a second compound which contains carbon, hydrogen, and fluorine. Concentrations of the first and second compounds are chosen in a ratio for a predetermined amount of polymer that will be deposited during an etch step to create sidewalls on the nitride features. The sidewalls are etched through exposure to the selected process chemistry.

The amount of polymer deposited during the etch of the first step will determine the resulting critical dimension bias. Selecting the process chemistry for greater polymer deposition on the nitride feature sidewalls will result in a higher critical dimension bias, while selecting the process chemistry for lower polymer deposition on nitride feature sidewalls result in a lower critical dimension bias. Higher deposition of polymer is achieved by increasing the amount of the first compound. Additionally, the etch of the first step will promote additional polymer deposition by adding hydrogen to a carbon and fluorine containing plasma during the etch.

The polymer formed on the sidewalls of the nitride features will typically be comprised of carbon and fluorine with some small amount of silicon.

The polymer acts to protect the nitride features from an over etch of the nitride features during the final etch of the second step, discussed below.

During the primary etch, the carbon containing fluorine compound preferably contains $CF_4$ as the first compound, and $CHF_3$ as the preferred second compound. A further example of the first and second compounds are, respectively, $C_2F_6$ and $CH_2F$.

Figure 4:
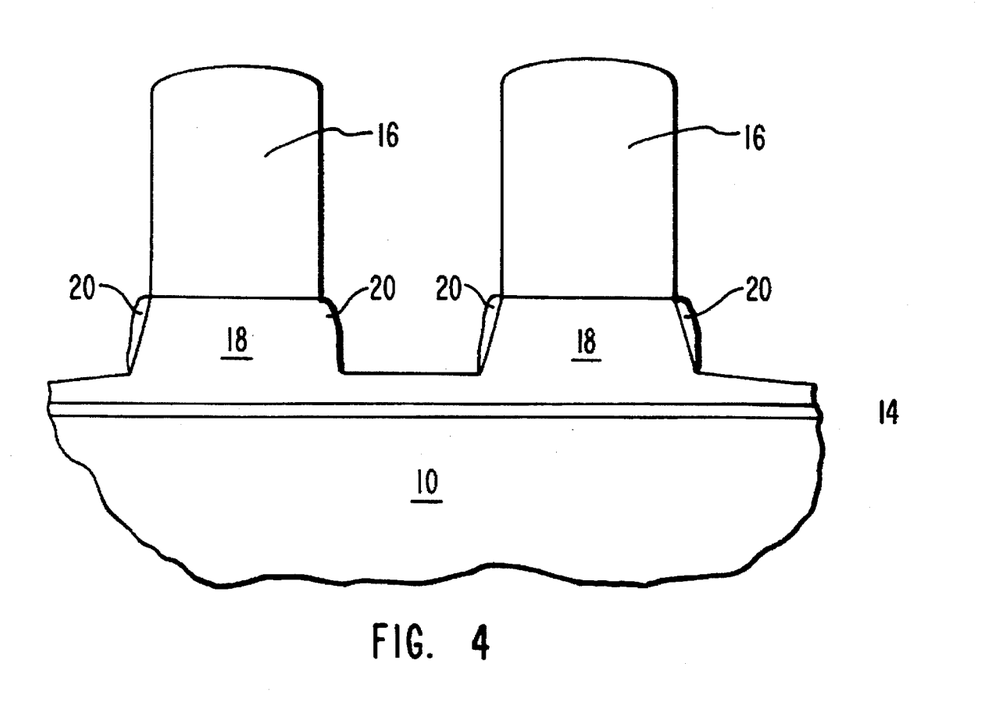
FIG. 4 is a schematic cross-section of the semiconductor substrate of FIG. 1 after undergoing the first step of the present invention.

In the first step of the novel nitride etching process, the result of which is shown in FIG. 4, the first and second compound chemistry is exposed to the silicon substrate in an initial etching step. This initial etch is preferably done as a dry etch in a reaction chamber such as an RIE or MRIE chamber.

By way of example, the RIE or MRIE primary etch of the first step comprises a first compound comprised of $CF_4$ that is flowed at a rate of approximately 50 sccm, and the second compound comprises $CHF_3$ that is flowed at a rate of approximately 50 sccm for a time in the approximate range of 30 seconds. The preferred pressure is in the approximate range of 200 mtorr and the preferred power is approximately 600 watts. The etch process is carded out in an Applied 5000 Magnetically Enhanced Reactive Ion Etcher, sold by Applied Materials Corporation of Santa Clara, Calif.

Alternatively, the process may be performed in a Lam Rainbow Etcher, wherein the process parameters shall be: 50 sccm $CF_4$, 50 sccm $CHF_3$, 300 sccm He, 250 mtorr, 300 watts, and 0.8 cm Gap, which etcher is sold by Lam Research, Inc. of Freemont, Calif., U.S.A. Of course, one having ordinary skill in the art will realize that the above values will vary depending on the make and model of the etcher used in the process.

Varying the pressure at which the reaction is conducted also affects the amount of polymer deposited on sidewalls of nitride features, and thus the critical dimension bias. For instance, using a higher pressure or lower power at a given concentration of $CHF_3$ to $CF_4$ will result in more polymer coating and will cause the critical dimension of grow. Using a lower pressure or a higher power will result in a less polymer coating and will cause the critical dimension to be reduced.

The second step of the novel nitride etching process comprises a final etch in the form of ion bombardment with $NF_3$ along with HBr the ion bombardment is conducted at high pressure and low power. High pressure is considered to be about 150 millitorr and above, but can vary with the etcher. For instance, in a LAM Rainbow Etcher, manufactured by LAM Research, Inc., described above, the high pressure would be classified at 100 millitorr and above. Low power would be considered to be about 100 watts and below. The high pressure and low power will result in a low ion energy, such that the final etch of nitride will be highly selective to oxide. Also, there will be a minimum critical dimension loss due to the polymer that is deposited during the primary etch of the first step, because during the final etch, the polymer protects the sidewalls of the nitride features.

Figure 5:
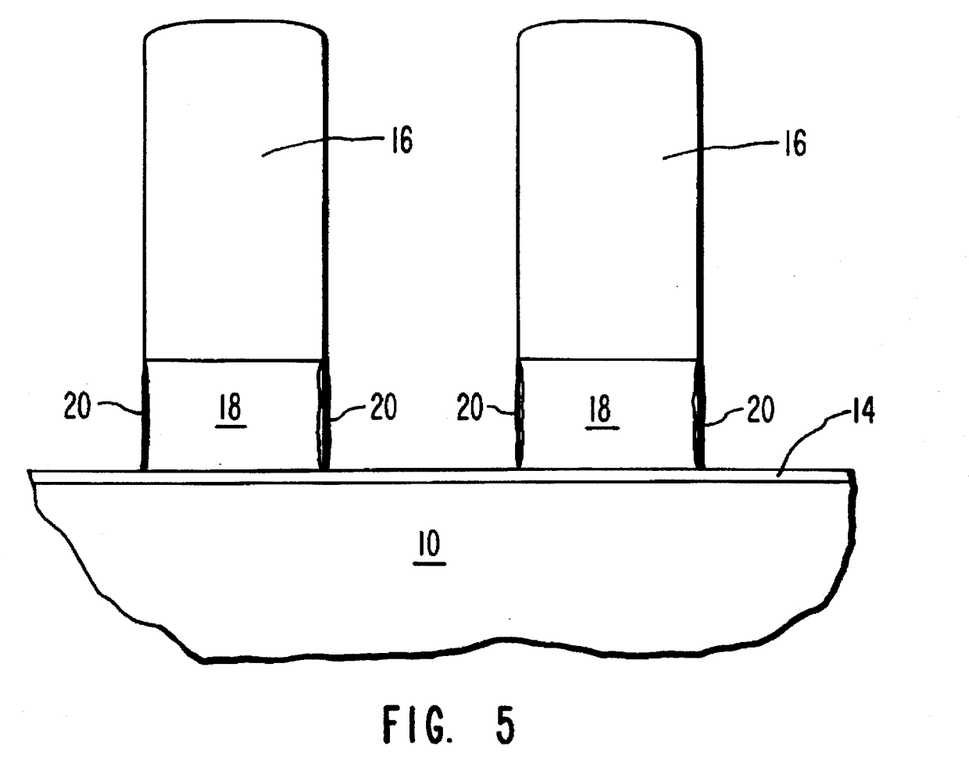
FIG. 5 is a schematic cross-section of the semiconductor substrate of FIG. 4 after undergoing the second step of the present inventive method.

During the final etch of the second step, some of the polymer will be etched off the sidewalls of the nitride features, as a kind of over etch of the polymer. When proper concentrations are chosen, the polymer will note be totally removed from the sidewalls of the nitride features, and thus, will not result in a negative critical dimension bias such that the nitride features would detrimentally be undercut. Thus, the desired result of the over etch of the polymer is shown in FIG. 5. The sidewalls of nitride feature 18, seen in FIG. 5, will be left with a slight coating of polymer 20 and will maintain the desired critical dimension bias, which will be preferably zero.

The ion bombardment of the final etch, using $NF_3$ and HBr, will be conducted in a etcher, such as an Applied Materials, Inc. etcher having process parameters at a pressure of between about 150 to about 250 millitorr, at a power of between about 75 to about 125 watts, at a temperature of between about 15° to about 25° C., a magnetism power of between about 75 to about 125 Gauss, and for a time of between 10 to about 40 seconds. It is preferred that the final etch will be conducted at about 200 millitorr, 100 Gauss, 100 watts, 20° C., and for a period of about 20 seconds. The use of lower pressures will reduce the tendency to form feet 24 as depicted in FIG. 3.

The polymer deposition on reaction chamber walls will preferably be fully removed during the final etch of the second step. The removal of polymers from reaction chamber walls creates a self-cleaning reaction chamber that is capable of a stable etch rate, as well as processing a high number of wafers before the reaction chamber is required to be cleaned. A high amount of wafers between such cleaning cycles is defined as being between about 2,000 to about 3,000 wafers.

Figure 6:
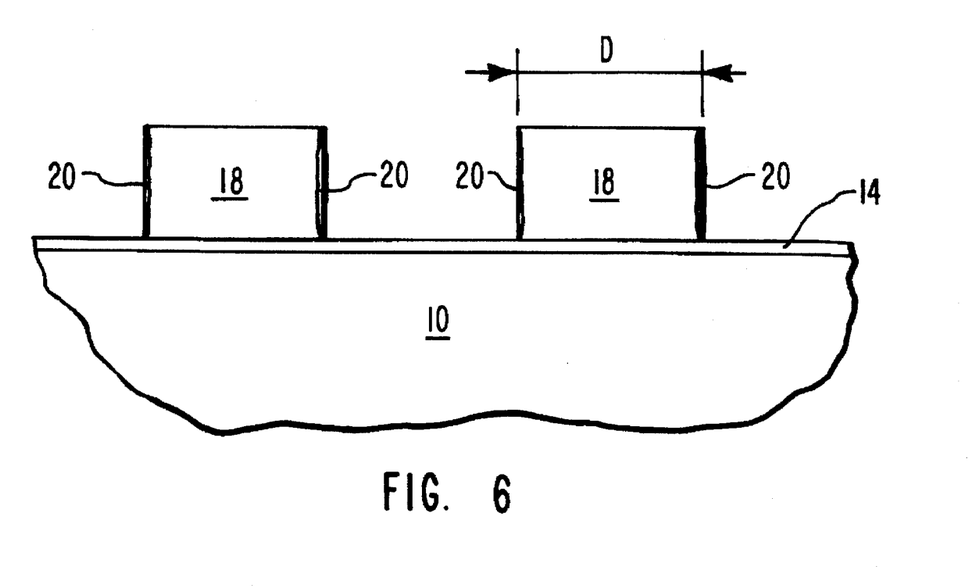
FIG. 6 is a schematic cross-section of the semiconductor substrate of FIG. 5 after undergoing a process of stripping the photoresist layer seen in FIG. 5.

A further step, which is typically conducted when forming nitride spacer structures, is the step of stripping the patterned and etched photoresist layer to leave the patterned nitride layer formed on the silicon substrate, as is illustrated in FIG. 6. Thereafter, in the LOCOS process, the silicon substrate having exposed pad oxide thereon is typically oxidized to form field oxide regions.

Through the use of the foregoing two process flow steps, a critical dimension bias of zero can be maintained, resulting in a fully anisotropic etch, i.e., the walls of the etched nitride features will be substantially perpendicular to the semiconductor substrate surface. There is essentially no undercutting of the nitride features. Thus, submicron features can be etched with considerable reliability. The anisotropic etch of nitride features prepares the nitride features for later field oxidation or other processes. A negative or positive critical dimension bias, where desirable, can also be selected by varying the ratio of the first and second compound in the process chemistry of the first step, by varying the pressure or power of the initial etch in the first step, or by varying the intensity of the magnetic field in an MRIE etcher, as described above. By way of example, a negative or a positive critical dimension bias may be desirable when a photolithography process is more robust in a region of positive or negative CD bias.

From the foregoing it is seen that the various parameters can be tuned to select a desired critical dimension bias. The tunability of the critical dimension bias is a function of the polymer deposited upon nitride features. The greater the critical dimension bias, the greater deposition of polymer. The lower the critical dimension bias, the lesser deposition of polymer.

The current process also allows for greater structural density and variation while reducing loading effects. That is, tight areas will be etched at the same rate as open areas with the novel process. Further, the etch will have a non-uniformity rate as low as about 5%. The final etch of the second step has been found to etch nitride with selectivity to oxide in a ratio of about 8:1 using a pressure of about 200 millitorr and a power of about 100 watts in an Applied Material, Inc. etcher, as described above.

The over etch of polymer from nitride sidewalls, as described with respect to the second step, is used in order to reduce the percentage of non-uniformity. The initial etch has a high etch rate, that is not highly selective to oxide. Thus, the initial etch is not permitted to etch for periods of time sufficient to etch down to the pad oxide. The final etch, which may be used to etch the polymer from the sidewalls of the nitride features, is used to finish the etching process. In a typical process, the initial etch preferably will reduce nitride film from about 2,400 Angstroms by about 2,000 Angstroms. The final etch would then reduce the remaining nitride film to about 400 Angstroms.

During the final etch, end point detection and a percentage over etch can be used to determine the period of time for the final etch of the second step. The final etch should be conducted long enough to fully etch nitride, but not "punch through" the pad oxide to the silicon substrate. The final etch will also be a "self-cleaning" step so as to remove all polymer from the reaction chamber walls so as to increase the wafers between clean cycle of the etcher.

With the present inventive method, line widths as narrow as 0.35 μM can be formed with between a range of about 0.6 and 1.2 μM photoresist thickness with very little loading and a uniformity of around about 5% using RIE or MRIE etchers. Furthermore, pad oxides as thin as 130 Angstroms can be used with little or no critical dimension bias.

The nitride features may be used, for example, in the formation of nitride spacers and construction of a gate stack over a word line. The novel etch process is useful, however, wherever a nitride is to be etched with a straight or normal nitride sidewall with respect to a silicon substrate thereunder.

Unlike much of the prior art nitride etching processes, which are pattern dependent, the present inventive nitride etching method is non-pattern dependent. Therefore, where different wafer circuits, i.e., 4 MEG DRAM or 16 MEG DRAM, are processed on the same process line, the process line can change wafer circuits without reoptimizing the process parameters with the change of wafer circuits.

Due to the polymer deposition and variation in etch rates, the problems of the prior art nitride etching methods are overcome. Specifically, there is no need for large isotropic components of prior art etches which typically employ $SF_6$, and thereby have a large tendency to undercut the photoresist layer, resulting in negative critical dimension bias.

The present invention may be embodied in other specific forms without departing from its spirit or essential characteristics. The described embodiments are considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. An etch process for improving etch uniformity, comprising the steps of:
   (a) bombarding a layered substrate with an ionized carbon containing fluorine compound, said substrate having at least one nitride layer disposed thereon, said ionized carbon containing fluorine compound depositing a layer of a polymer on said nitride layer during said bombardment, said nitride layer being patterned; and
   (b) bombarding said layered substrate with an ionized hydrogen halide and ionized $NF_3$, said ionized hydrogen halide and ionized $NF_3$ removing portions of said nitride layer, thereby creating substantially straight sidewalls in said nitride layer.

2. The process of claim 1, wherein the step of bombarding a layered substrate with an ionized carbon containing fluorine compound etches the nitride layer at a rate faster than an etch rate of the nitride layer in said step of bombarding said layered substrate with an ionized hydrogen halide and ionized $NF_3$.

3. The process according to claim 1, wherein said layered substrate comprises a layer of oxide subadjacent said nitride layer.

4. The process according to claim 3, wherein said step of bombarding said layered substrate with an ionized hydrogen halide and ionized $NF_3$ etches nitride to oxide in a ratio of about 8:1.

5. The process according to claim 1, wherein said hydrogen halide comprises HBr.

6. The process according to claim 1, wherein said ions are generated in a reactive ion etcher.

7. The process according to claim 6, wherein the reactive ion etcher is operated at a variable pressure and a variable power to vary the thickness of the deposited polymer on said nitride layer during said step of bombarding a layered substrate with an ionized carbon containing fluorine compound, and wherein the nitride layer has a critical dimension bias that is selectable by varying the thickness of the polymer layer deposited on the nitride layer, whereby by depositing a greater thickness of said polymer layer on said nitride layer results in a higher critical dimension bias, and depositing a lesser thickness of said polymer layer on said nitride layer results in a lower critical dimension bias.

8. The process according to claim 6, wherein said reactive ion etcher has sidewalls upon which is deposited a layer of said polymer during said step of bombarding a layered substrate with an ionized carbon containing fluorine compound, and wherein said step of bombarding said layered substrate with an ionized hydrogen halide and ionized $NF_3$ substantially removes the polymer layer deposited on the sidewalls of said reactive ion etcher.

9. The process according to claim 1, wherein the ionized carbon containing fluorine compound comprises a mixture of predetermined amounts of a first compound containing carbon and fluorine and a second compound containing carbon, hydrogen, and fluorine in concentrations chosen to select a predetermined amount of said polymer to be deposited on said nitride layer.

10. The process according to claim 9, wherein said first compound containing carbon and fluorine comprises $CF_4$ and the second compound containing carbon, hydrogen, and fluorine comprises $CHF_3$.

11. The process according to claim 9, wherein said first compound containing carbon and fluorine comprises $C_2F_6$ and the second compound containing carbon, hydrogen, and fluorine comprises $CH_2F_2$.

12. A semiconductor device formed according to the process of claim 1.

13. An etch process for improving etch uniformity, comprising the steps of:
   (a) exposing a semiconductor substrate to an ionized carbon containing fluorine compound, said substrate having at least one nitride layer disposed thereon, said carbon containing fluorine compound etching sidewalls in said nitride layer, said sidewalls being substantially normal to said substrate, said carbon containing fluorine compound depositing a layer of a polymer on said sidewalls in said nitride layer during said exposure; and
   (b) exposing said semiconductor substrate to an ionized hydrogen halide.

14. The process of claim 13, wherein the step of exposing a semiconductor substrate to an ionized carbon containing fluorine compound etches the nitride layer at a rate faster than an etch rate of the nitride layer in said step of exposing said semiconductor substrate to an ionized hydrogen halide.

15. The process according to claim 13, wherein said substrate is exposed to the carbon containing fluorine compound comprising a mixture of predetermined mounts of a first compound containing carbon and fluorine and a second compound containing carbon, hydrogen, and fluorine in concentrations chosen to select a predetermined amount of said polymer to be deposited on said nitride layer, wherein said first compound containing carbon and fluorine comprises $CF_4$ and the second compound containing carbon, hydrogen, and fluorine comprises $CHF_3$.

16. The process according to claim 15, wherein said substrate is exposed to ionized $NF_3$ in combination with said ionized hydrogen halide.

17. The process according to claim 16, wherein said nitride layer is disposed on an oxide layer, said nitride layer being patterned with a photoresist layer, said ionized hydrogen halide enhancing selectivity to said oxide layer.

18. The process according to claim 17, wherein said step of exposing said semiconductor substrate to an ionized hydrogen halide etches nitride to oxide in a ratio of about 8:1.

19. The process according to claim 17, wherein said ions are generated in at least one of a reactive ion etcher, a magnetically enhanced reactive ion etcher, and a high density source reactor.

20. The process according to claim 19, wherein said at least one of a reactive ion etcher, a magnetically enhanced reactive ion etcher, and a high density source reactor is operated at a variable pressure and a variable power to vary the thickness of the deposited polymer layer on said sidewalls of said nitride layer during said step of exposing a semiconductor substrate to an ionized carbon containing fluorine compound, and wherein the nitride layer has a critical dimension bias that is selectable by varying the thickness of the polymer layer deposited on the sidewalls of the nitride layer, whereby by depositing a greater thickness of said polymer layer on said sidewalls of said nitride layer results in a higher critical dimension bias, and depositing a lesser thickness of said polymer layer on said sidewalls of said nitride layer results in a lower critical dimension bias.

21. The process according to claim 20, wherein each of said at least one of a reactive ion etcher, a magnetically enhanced reactive ion etcher, and a high density source reactor has sidewalls upon which is deposited a layer of said polymer during said step of exposing said semiconductor substrate to an ionized carbon containing fluorine compound, and wherein said step of exposing said semiconductor substrate to an ionized hydrogen halide substantially removes the polymer layer deposited on the sidewalls of said at least one of a reactive ion etcher, a magnetically enhanced reactive ion etcher, and a high density source reactor.

22. The process according to claim 20, wherein the said hydrogen halide ions are generated from at least one of HCl, HBr, and HI.

23. A semiconductor device formed according to the process of claim 13.

24. A method to enhance etching of submicon features, said method comprising the steps of:

(a) layering a semiconductor substrate with at least one layer of oxide and at least one layer of nitride patterned with a photoresist layer;

(b) exposing said semiconductor substrate to an ionized carbon containing fluorine compound comprising a mixture of predetermined amounts of a first compound containing carbon and fluorine and a second compound containing carbon, hydrogen, and fluorine in concentrations chosen to select a predetermined amount of said polymer to be deposited on said nitride layer, wherein said first compound containing carbon and fluorine comprises $CF_4$ and the second compound containing carbon, hydrogen, and fluorine comprises $CHF_3$, said substrate having at least one nitride layer disposed thereon, said carbon containing fluorine compound etching sidewalls in said nitride layer, said sidewalls being substantially normal to said substrate, said ionized carbon containing fluorine compound depositing a layer of a polymer on said sidewalls in said nitride layer during said exposure; and (c) exposing said semiconductor substrate to an ionized $NF_3$ in combination with an ionized HBr to enhance selectivity to said oxide layer.

25. The process according to claim 24, wherein said step of exposing said semiconductor substrate to an ionized $NF_3$ in combination with an ionized HBr etches nitride to oxide in a ratio of about 8:1.

26. The process according to claim 24, wherein said ions are generated in at least one of a reactive ion etcher, a magnetically enhanced reactive ion etcher, and a high density source reactor.

27. The process according to claim 26, wherein said at least one of a reactive ion etcher, a magnetically enhanced reactive ion etcher, and a high density source reactor is operated at a variable pressure and a variable power to vary the thickness of the deposited polymer layer on said sidewalls of said nitride layer during said step of exposing a semiconductor substrate to an ionized carbon containing fluorine compound, and wherein the nitride layer has a critical dimension bias that is selectable by varying the thickness of the polymer layer deposited on the sidewalls of the nitride layer, whereby by depositing a greater thickness of said polymer layer on said sidewalls of said nitride layer results in a higher critical dimension bias, and depositing a lesser thickness of said polymer layer on said sidewalls of said nitride layer results in a lower critical dimension bias.

28. The process according to claim 26, wherein each of said at least one of a reactive ion etcher, a magnetically enhanced reactive ion etcher, and a high density source reactor has sidewalls upon which is deposited a layer of said polymer during said step of exposing said semiconductor substrate to an ionized carbon containing fluorine compound, and wherein said step of exposing said semiconductor substrate to an ionized $NF_3$ in combination with an ionized HBr substantially removes the polymer layer deposited on the sidewalls of said at least one of a reactive ion etcher, a magnetically enhanced reactive ion etcher, and a high density source reactor.

29. A semiconductor device formed according to the process of claim 24.

* * * * *

UNITED STATES PATENT AND TRADEMARK OFFICE
CERTIFICATE OF CORRECTION

PATENT NO. : 5,644,153
DATED : July 1, 1997
INVENTOR(S) : David J. Keller

It is certified that error appears in the above-identified patent and that said Letters Patent is hereby corrected as shown below:

Col. 1, line 7, after "formation" delete "on"

Col. 2, line 3, change "side i effects" to --side effects--

Col. 2, line 57, change "chamber, Thus," to either --chamber. Thus,--

Col. 3, line 42, change "an nitride" to --a nitride--

Col. 6, line 55, after "process is" change "carded" to --carried--

Col. 7, line 27, change "note" to --not--

Col. 9, line 58, after "whereby" delete "by"

Col. 10, line 40, after "predetermined" change "mounts" to --amounts--

Signed and Sealed this

Thirty-first Day of March, 1998

*Attest:*

BRUCE LEHMAN

*Attesting Officer*   *Commissioner of Patents and Trademarks*